United States Patent
Morris

(10) Patent No.: US 11,476,792 B2
(45) Date of Patent: Oct. 18, 2022

(54) METHOD AND APPARATUS FOR ELECTRICAL COMPONENT LIFE ESTIMATION WITH CORROSION COMPENSATION

(71) Applicant: Rockwell Automation Technologies, Inc., Mayfield Heights, OH (US)

(72) Inventor: Garron K. Morris, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 140 days.

(21) Appl. No.: 16/902,543

(22) Filed: Jun. 16, 2020

(65) Prior Publication Data

US 2021/0391820 A1  Dec. 16, 2021

(51) Int. Cl.
| | |
|---|---|
| *H02P 29/68* | (2016.01) |
| *H02P 29/024* | (2016.01) |
| *G01R 31/26* | (2020.01) |
| *G01R 31/27* | (2006.01) |
| *G01R 31/34* | (2020.01) |
| *H02P 23/12* | (2006.01) |
| *H02P 23/14* | (2006.01) |

(52) U.S. Cl.
CPC .......... *H02P 29/68* (2016.02); *G01R 31/2619* (2013.01); *G01R 31/27* (2013.01); *G01R 31/343* (2013.01); *H02P 23/12* (2013.01); *H02P 23/14* (2013.01); *H02P 29/0241* (2016.02)

(58) Field of Classification Search
CPC .......... H02P 29/68; H02P 23/12; H02P 23/14; H02P 29/0241; G01R 31/2619; G01R 31/27; G01R 31/343; G01N 17/00; G01N 17/008; G01N 17/043; G01N 17/046; G06F 3/0616

See application file for complete search history.

(56) References Cited

U.S. PATENT DOCUMENTS

| | | | |
|---|---|---|---|
| 9,092,030 B2 | 7/2015 | Weiss et al. | |
| 9,869,722 B1 * | 1/2018 | Morris | G01R 31/2849 |
| 10,620,114 B2 * | 4/2020 | Brookhart | B64F 5/60 |
| 2002/0153882 A1 | 10/2002 | Grimes et al. | |
| 2004/0030524 A1 | 2/2004 | Jarrell et al. | |
| 2007/0150236 A1 | 6/2007 | Warizaya | |

(Continued)

FOREIGN PATENT DOCUMENTS

| | | | |
|---|---|---|---|
| EP | 3048451 A1 | 7/2016 | |
| EP | 3299829 A1 | 3/2018 | |
| GB | 2396917 A * | 7/2004 | G01N 17/00 |

OTHER PUBLICATIONS

Nathan Valentine, Failure Mechanisms of Insulated Gate Bipolar Transistors (IGBTs), 2015, CALCE, 1-30 (Year: 2015).*

(Continued)

*Primary Examiner* — Bickey Dhakal
(74) *Attorney, Agent, or Firm* — Fay Sharpe LLP

(57) ABSTRACT

Systems and methods for estimating electrical component degradation include a processor programmed to: compute a cumulative degradation value for an electrical system component of an electrical system based on an operating parameter of the electrical system component; and to compute a corrosion compensated cumulative degradation value for the electrical system component based on the cumulative degradation value and a corrosion rating of the electrical system.

21 Claims, 8 Drawing Sheets

(56) References Cited

U.S. PATENT DOCUMENTS

| | | | |
|---|---|---|---|
| 2009/0063057 A1 | 3/2009 | Miettinen | |
| 2013/0241567 A1 | 9/2013 | Boehm et al. | |
| 2013/0260664 A1 | 10/2013 | Morris et al. | |
| 2013/0331962 A1 | 12/2013 | Morris | |
| 2013/0331963 A1 | 12/2013 | Ahangar et al. | |
| 2014/0030089 A1 | 1/2014 | Wickstrom | |
| 2014/0212978 A1* | 7/2014 | Sharpe, Jr. | G01N 17/00 436/6 |
| 2014/0247560 A1 | 9/2014 | Lemberg et al. | |
| 2014/0265976 A1 | 9/2014 | Weiss et al. | |
| 2017/0160237 A1 | 6/2017 | Freer et al. | |
| 2018/0284011 A1* | 10/2018 | Farkas | G01R 17/02 |

OTHER PUBLICATIONS

Laura Nicola, Lifetime estimation of IGBT power modules, 2013, 11-44 (Year: 2013).*

European Search Report and Opinion dated Feb. 20, 2018 of Application No. EP17186354, 6 pages.

European Office Action dated Nov. 9, 2021 of Application No. EP17186354, 7 pages.

Mika Ikonen "Power cycling lifetime estimation of EGBT power modules based on chip temperature modeling", Lappeenranta University of Technology, https://lutpub.lut.fi/bitstream/handle/10024/86334/isbn%209789522653550.pdf?isAllowed=y&sequence=1, downloaded Nov. 17, 2021, 120 pgs.

Extended European Search Report dated Oct. 13, 2021 Application No. EP133591, 9 pages.

Peter Andrew James, Health Monitoring of IGBTs in Automotive Power Converter Systems, Dissertation, The University of Manchester School of Electrical and Electronic Engineering, 2012.

* cited by examiner

| | SILVER REACTIVITY (Å / 30 days) | | | | |
|---|---|---|---|---|---|
| | 1-199 | 200-999 | 1000-1999 | 2000-4999 | 5000-30000 |
| COPPER REACTIVITY (Å / 30 days) 1-299 | G1 | G2 | G3 | GX | GX+ |
| 300-999 | G2 | G2 | G3 | GX | GX+ |
| 1000-1999 | G3 | G3 | G3 | GX | GX+ |
| 2000-4999 | GX | GX | GX | GX | GX+ |
| 5000-30000 | GX+ | GX+ | GX+ | GX+ | GX+ |

| COPPER REACTIVITY (Å / 30 days) | SILVER REACTIVITY (Å / 30 days) | ISA 71.04 ENVIRONMENT CLASS | DRIVE TYPE 1 DRIVE DERATING FACTOR $K_{DRIVE}$ | DRIVE TYPE 2 DRIVE DERATING FACTOR $K_{DRIVE}$ |
|---|---|---|---|---|
| 1-299 | 1-199 | G1 | 1.00 | 1.00 |
| 300-999 | 200-999 | G2 | 0.84 | 1.00 |
| 1000-1999 | 1000-1999 | G3 | 0.53 | 1.00 |
| 2000-4199 | 2000-4199 | GX | 0.37 | 0.75 |
| >4200 | >4200 | GX+ | 0.125 | 0.50 |

FIG. 5

| DRIVE CLASS RATING | DRIVE TYPE 1 DRIVE IGBT DERATING FACTOR $K_{COMPONENT}$ | DRIVE TYPE 2 DRIVE IGBT DERATING FACTOR $K_{COMPONENT}$ |
|---|---|---|
| IP00 | 0.50 | 0.75 |
| IP20/21 | 0.50 | 0.75 |
| IP54 | 0.75 | 1.00 |
| IP66 | 0.50 | 1.00 |

FIG. 6

| ISA 71.04 ENVIRONMENT CLASS | MTBF PERCENT REDUCTION |
|---|---|
| G1 | 0 |
| G2 | <25 |
| G3 | <50 |
| GX | <75 |
| GX+ | ≥75 |

| INDUSTRY | DRIVE TYPE 1 DRIVE DERATING FACTOR $K_{DRIVE}$ | DRIVE TYPE 2 DRIVE DERATING FACTOR $K_{DRIVE}$ |
|---|---|---|
| AUTOMOTIVE | 0.85 | 1.00 |
| G3 | 0.75 | 1.00 |
| TIRE/RUBBER | 0.50 | 1.00 |
| GX+ | 0.25 | 0.75 |

METHOD AND APPARATUS FOR ELECTRICAL COMPONENT LIFE ESTIMATION WITH CORROSION COMPENSATION

BACKGROUND INFORMATION

The subject matter disclosed herein relates to electrical component degradation estimation.

BRIEF DESCRIPTION

Disclosed examples include systems and methods, including computing a cumulative degradation value for an electrical system component of an electrical system based on an operating parameter of the electrical system component, and computing a corrosion compensated cumulative degradation value for the for an electrical system component based on the cumulative degradation value and a corrosion rating of the electrical system.

BRIEF DESCRIPTION OF THE DRAWINGS

FIG. 5 is a schematic diagram of a corrosive environment classification table with drive corrosion derating factors.

FIG. 6 is a schematic diagram of a corrosive environment classification table with IGBT component corrosion derating factors.

FIG. 7 is a schematic diagram of a corrosive environment classification table with mean time between failure (MTBF) reduction.

FIG. 13 is a drive derating table by industry.

DETAILED DESCRIPTION

Electrical systems, such as industrial systems with power converters and other electrical machines, are sometimes subjected to harsh environments. Corrosion can cause or accelerate degradation of industrial electronics and components of industrial systems, leading to unplanned downtime and reduced revenue for industrial manufacturing facilities. Described examples provide motor drives and other industrial systems, as well as methods and computer-readable mediums to assess overall component degradation at a manufacturing facility or other industrial equipment installation with corrosion compensation. In certain examples, a motor drive power converter provides on-board prognostic degradation determination with alarms and/or warnings or other indications (e.g., output parameters to a customer) of electrical component health to a user, such as through a network or a user interface, for example regarding estimated remaining component or system lifetime, mean time between failure (MTBF) information, percent consumed life, or the like, which may be triggered by threshold conditions associated with one or more electrical components in the system. The described examples provide degradation-based algorithms implemented in a system processor, whether in a motor drive or other industrial component, and/or in an on-site or remote network server or another network element. Moreover, the described systems and techniques can be employed in a variety of industrial equipment beyond power conversion systems to estimate and track cumulative component degradation for many different applications, including without limitation adaptive maintenance scheduling to mitigate or avoid unscheduled system downtime.

Figure 1:
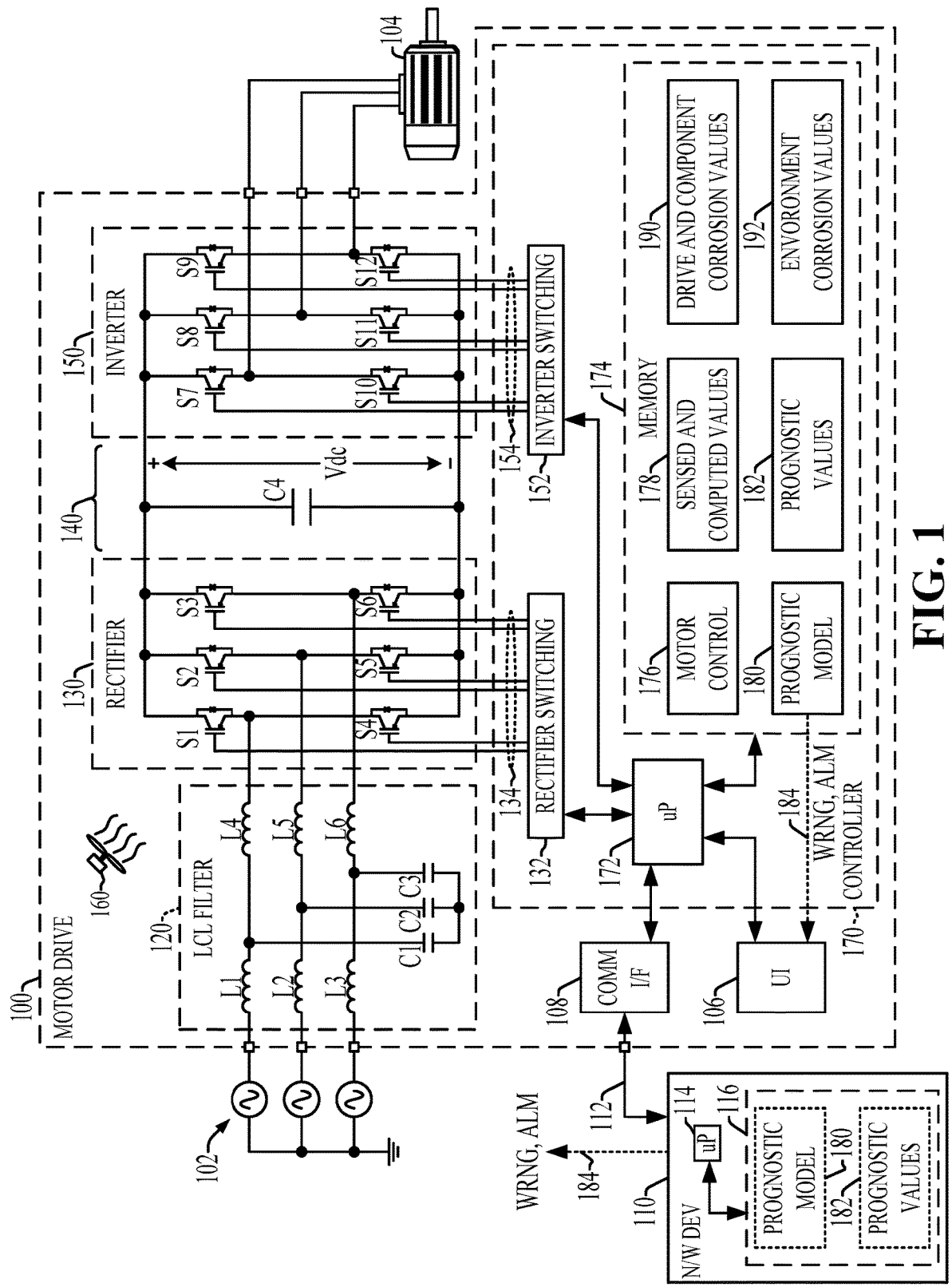
FIG. 1 is a schematic diagram of a motor drive power conversion system with a prognostic model with corrosion compensation.

FIG. 1 illustrates an example electrical system to convert electrical power to drive a load. The example system includes a motor drive power conversion system 100 receiving single or multiphase AC input power from an external power source 102. The illustrated example receives a three-phase input. In other examples, single phase or other multiphase embodiments are possible. The motor drive 100 converts input power from the source 102 to deliver output power to drive a motor load 104. The motor drive 100 includes a three phase LCL input filter circuit 120 having grid side inductors L1, L2 and L3 connected to the power leads of the power source 102, series connected converter side inductors L4, L5 and L6, and filter capacitors C1, C2 and C3 connected between the corresponding grid and converter side inductors and a common connection node, which may but need not be connected to a system ground. The motor drive 100 also includes a rectifier 130, a DC bus or DC link circuit 140, an output inverter 150 and a fan 160 to circulate air within a drive enclosure (not shown) for cooling one or more system electrical components.

The rectifier 130 and the inverter 150 are operated by a controller 170. The controller 170 includes a processor 172, an electronic memory 174 that stores data and program instructions, as well as a rectifier controller 132 and an inverter controller 152. The controller 170 and the components thereof may be implemented as any suitable hardware, processor-executed software, processor-executed firmware, logic, and/or combinations thereof wherein the illustrated controller 170 can be implemented largely in processor-executed software or firmware providing various control functions by which the controller 170 receives feedback and/or input signals and/or values (e.g., setpoint(s)) and provides rectifier and inverter switching control signals 134 and 154 to operate switching devices S1-S6 of the rectifier 130 and switches S7-S12 of the inverter 150 to convert input power for providing AC output power to drive the load 104. In addition, the controller 170 and the components 132, 152 thereof can be implemented in a single processor-based device, such as a microprocessor, microcontroller, FPGA, etc., or one or more of these can be separately implemented in unitary or distributed fashion by two or more processor devices.

The motor drive 100 in one example provides an active front end (AFE) including a switching rectifier (also referred to as a converter) 130 receiving three-phase power from the source 102 through the filter circuit 120. The active rectifier 130 includes rectifier switches S1-S6, which may be insulated gate bipolar transistors (IGBTs) or other suitable form of semiconductor-based switching devices operable according to a corresponding rectifier switching control signal 134 to selectively conduct current when actuated. In addition, diodes are connected across the individual IGBTs S1-S6. In operation, switching of the rectifier switches S1-S6 is controlled according to pulse width modulated rectifier switching control signals 134 from the rectifier switching controller 132 to provide active rectification of the AC input power from the source 102 to provide a DC bus voltage Vdc across a DC bus capacitor C4 in the DC link circuit 140. The inverter 150 includes switches S7-S12 coupled to receive power from the DC bus 140 and to provide AC output power to a motor or other load 104. The inverter switches S7-S12 can be any form of suitable high-speed switching devices, including without limitation IGBTs that operate according to switching control signals 154 from the inverter switching control component 152 of the drive controller 170.

In certain examples, the controller 170 receives various input signals or values, including setpoint signals or values for desired output operation, such as motor speed, position, torque, etc., as well as feedback signals or values representing operational values of various portions of the motor drive 100 and electrical system components of the drive 100. For example, the drive 100 includes various sensors (not shown) to provide sensor signals to the controller 172 indicate operating conditions of one or more components in the drive system 100, including thermocouples, RTDs or other temperature sensors to provide signals or values to the controller 170 indicating the temperatures of the switches S1-S12, the filter and DC bus capacitors C1-C4, ambient temperature(s) associated with the interior of the motor drive enclosure, such as a local temperature around (e.g., proximate) fan, voltages associated with one or more components (e.g., voltages associated with the switches S1-S12, voltages across the capacitors C1-C4), operating speed (rpm) of the fan 160, etc. In addition, the controller 170 in certain examples receives one or more voltage and/or current feedback signals or values from sensors to indicate the DC bus voltage Vdc, line to line AC input voltage values, motor line to line voltage values and/or currents, etc. In certain examples, the system 100 also includes one or more humidity or moisture sensors to sense ambient humidity within an enclosure, although not a strict requirement of all possible implementations.

The controller 170 in one example receives and stores this information as sensed and computed values 178 in the memory 174. The stored values 178 can include values computed by the processor 172 based on one or more sensor signals or values, such as temperature change values (e.g., ΔT) representing the temperature of a component relative to the ambient temperature of the drive enclosure. The sensed and computed values 178 in one example are obtained or updated periodically by the processor 172, and the controller 170 includes suitable sensor interface and/or communications circuitry to receive sensor signals and/or digital values from sensors in the drive system 100. In certain implementations, the processor 172 uses certain of this information 178 to perform closed loop control of the operation of the motor load 104 by execution of motor control program instructions 176 stored in the memory 174, such as speed control, torque control, etc.

In addition, the controller 170 in certain examples implements prognostic functions by executing program instructions 180 to estimate degradation of one or more electrical system components of the motor drive 100. In addition, the memory 174 stores one or more prognostic values 182. The processor 172 in one example implements the prognostic model program instructions 182 estimate electrical component degradation and selectively generate one or more alarm and/or warning signals or messages 184 to identify degradation of one or more electrical components to a user. The memory 174 also stores drive and component corrosion values 190, such as derating factors for the entire system and component derating values, as well as environment corrosion values 192, such as reactivity rates for one or more metals (e.g., copper, silver, etc., and/or corrosive environment classifications as described further below.

As shown in the example of FIG. 1, the processor 172 is operatively coupled with a user interface (UI) 106, such as a touchscreen or other user interface associated with the motor drive system 100. In certain examples, the control processor 172 provides one or more warnings and/or alarms 184 to the user interface 106 to alert the user to certain threshold conditions associated with one or more electrical components in the drive 100. In one example, the processor 172 uses an assessment of environmental corrosion at an installed site to automatically adjust predictive maintenance algorithms to account for the effects of corrosion. The described examples extend the capabilities of the predictive maintenance by providing a method to adjust the algorithms to compensate for corrosive environments to help reduce or avoid unplanned system downtime. The described systems and techniques can be extended to use chemical, temperature, and humidity sensors to provide the environmental inputs as well as data analytics and visualization to track environmental conditions and rates of life consumption for industrial products and systems implemented in an industrial site. In certain implementations, moreover, the corrosion compensation is accomplished without humidity sensors, for example, based on corrosion coupon characterization and/or industry type information programmed into the system. The described examples facilitate adaptation of maintenance scheduling to account for corrosion effects and other degrading effects on electrical components, such as bond wire and/or solder degradation of motor drive IGBTs.

In certain examples, moreover, the control processor 172 is operatively coupled with one or more network devices 110 via a communications interface 108 and a network connection 112, which can be wired, wireless, optical or combinations thereof. In certain examples, the controller 170 provides one or more of the sensed and/or computed values 178 to the network device 110 via the communications interface 108 and the network 112, and the network device 110 includes a processor 114 and a memory 116 to implement the prognostic model program instructions 180 and to store the prognostic values 182. In practice, any suitable processor can implement the degradation estimation concepts disclosed herein, whether an on-board processor 172 of the motor drive controller 170 or the processor 114 of the network device 110. In certain examples, the network device 110 can be a network server implementing the prognostic model 180 as program instructions for execution by the server processor 114. In another example, the network device 110 can be a process control device, such as a control module in a distributed control system (DCS), and the communications interface 108 and the network 112 can be a network of a DCS for exchanging values and messages (e.g., sensed and/or computed values 178) between the motor drive 100 and the control module 110.

Figure 2:
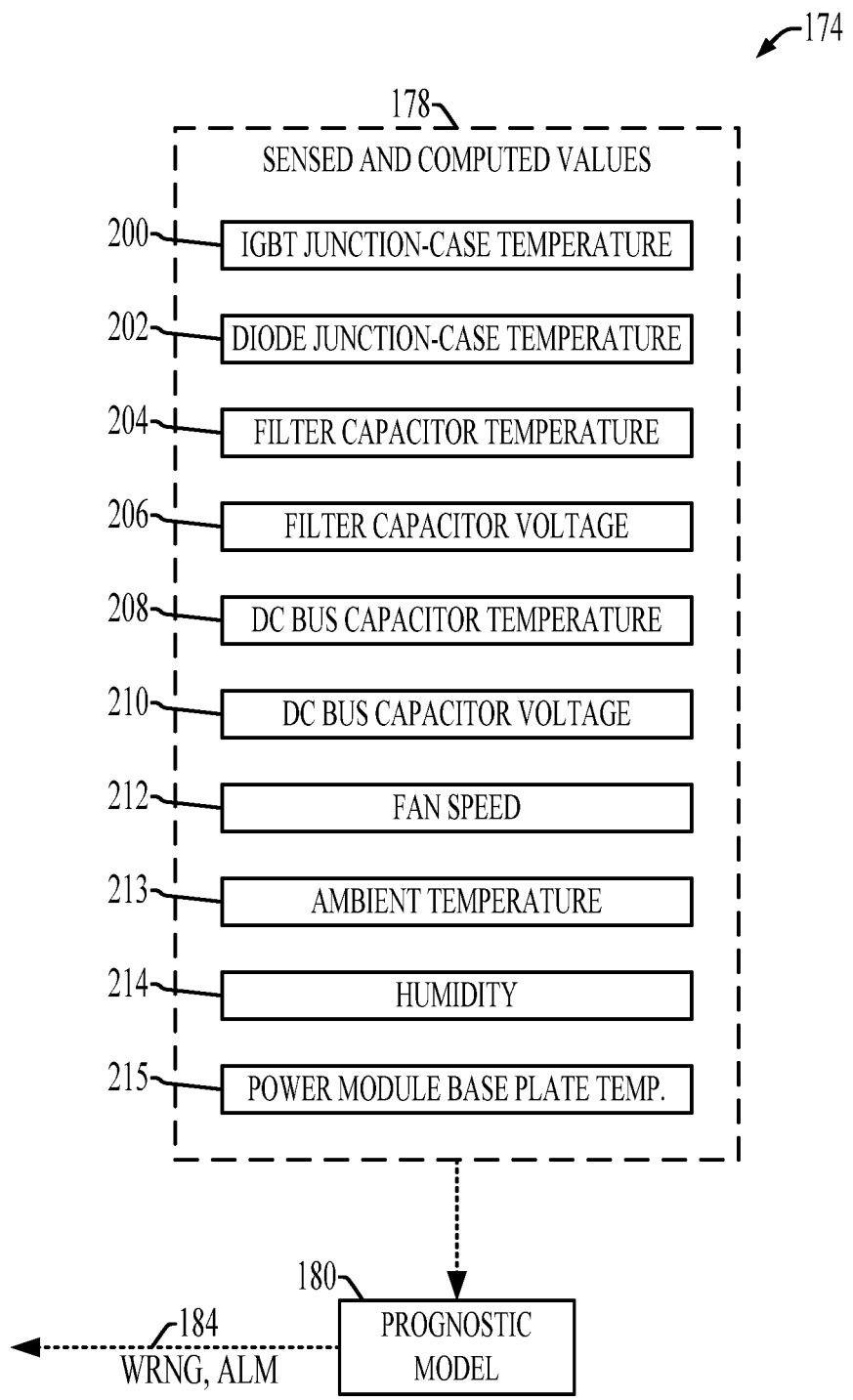
FIG. 2 is a schematic diagram of a prognostic model as well as sensed and computed values.

Referring also to FIGS. 2-7, the processor implemented prognostic model 180 operates on one or more sensed and/or computed values 178 stored in the memory 174. In certain examples, moreover, the model 180 uses values programmed by a user or configured based on user input, such as corrosion classifications and/or underlying reactivity rate information from analysis of corrosion test coupons. The operation of the prognostic model 180 is described hereinafter in the context of implementation by the control processor 172 via the electronic memory 174 in the drive controller 170. In other examples, the prognostic model 180 is implemented in a network device 110 or other processor-based system in similar fashion (e.g., processor 114 in FIG. 1). As illustrated in FIG. 2, the sensed and computed values 178 can be stored for one or more components of the electrical drive system 100 in one example. For example, the values 178 can be saved for the individual rectifier and/or inverter switches S1-S12, the drive capacitor C1-C4 and/or the drive cooling fan 160 in the example of FIGS. 1 and 2. In one example an IGBT junction-case temperature value 200 is stored in the memory 174 for each of the switches S1-S12. The value(s) may be computed, for example, with the IGBT junction-case temperature 200 being computed from the heat generation in the IGBT and a sensor value from a thermocouple or RTD individually associated with a given one of the switches S1-S12. As shown in FIG. 2, the sensed and computed values 178 may further include one or more diode junction-case temperatures 202, filter capacitor temperatures 204, filter capacitor voltages 206, DC bus capacitor temperatures 208, DC bus capacitor voltages 210, fan speed value 212, air temperature 213, and power module base plate temperature 215. In certain examples, moreover, the sensed and computed values 178 include one or more humidity values 214.

Figures 3, 4:
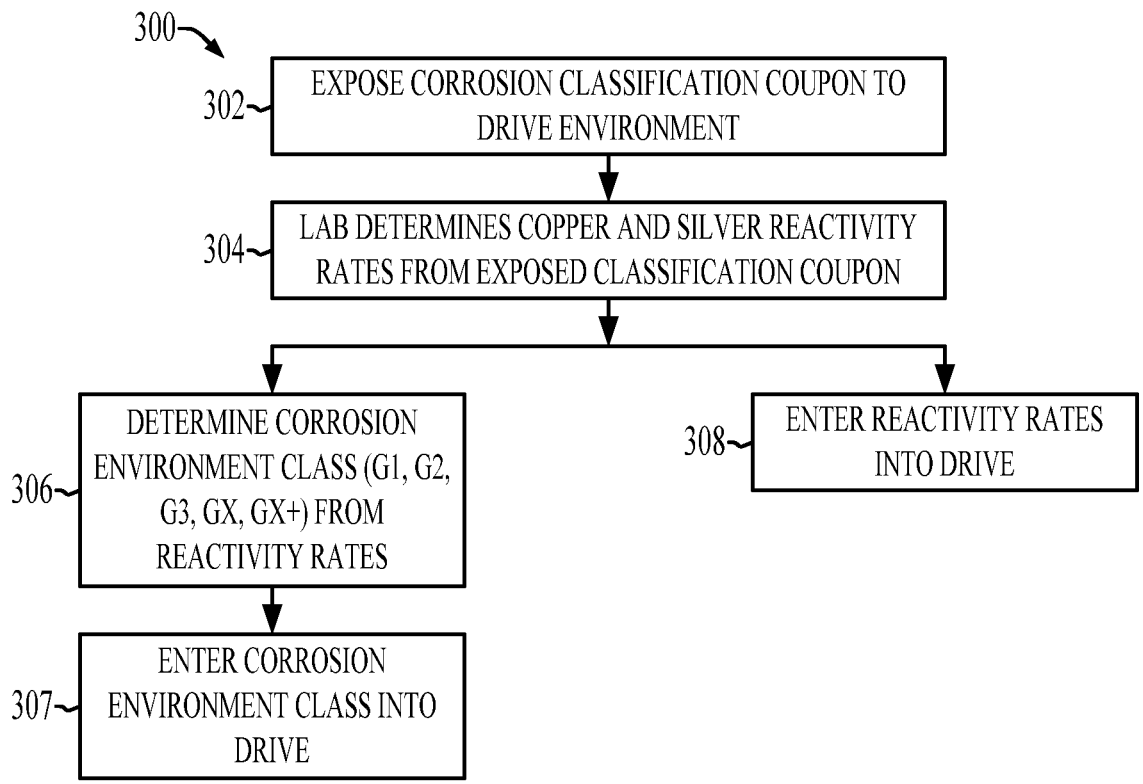
FIG. 3 is a flow diagram of a method to configure a prognostic model for corrosion compensation.
FIG. 4 is a schematic diagram of a corrosive environment classification.

FIG. 3 shows a method to configure the prognostic model 180 for corrosion compensation. At 302, a user exposes a corrosion classification coupon to the environment of the motor drive 100 or other system of interest. In one example, the coupon includes strips of copper and silver, and these are exposed to the drive environment, such as within a motor drive enclosure at an installed site, for a predetermined time, such as 30 days. At 304, a lab analyzes the metal strips of the coupon and determines copper and silver reactivity rates of the exposed classification coupon, for example, by measuring the thickness in angstroms of growth of the corroding copper and silver over a 30 day period for copper and silver, to determine the reactivity rates in units of Å/30 days. In one example, the user determines an environmental class at 306 (e.g., ISA 71.04 environment class G1, G2, G3, GX or other standards, such as Rockwell Automation environmental class GX+ defined to address a shortcoming of the ISA 71.04 standard where GX is defined with a lower specification limit only (>2000 Å/30 days)) according to the determined copper and silver reactivity rates determined at 304, for example, using a table 400 in FIG. 4. In this example, the user enters the determined environment class as part of a configuration of the drive 100 at 307 for storage in the memory 174 as an environment corrosion value or values 192 in FIG. 1. In another implementation, the user directly enters the copper and silver reactivity rates determined at 304 into the drive at 308, and the drive firmware or software determines the environment class. In another implementation, the drive 100 includes humidity and temperature sensors or other means to determine and update a corrosion classification in real time, which selectively updates the classification as environmental conditions change.

In one example, the processor 174 (FIG. 1) implements a corrosion impact engine of the prognostic model 180 that calculates or selects a drive derating factor $K_{DRIVE}$ and component-level derating factors $K_{COMPONENT}$ for individual drive components. In some examples, moreover, the drive 100 is configured with a drive type designation, such as type 1 for standard drives and type 2 for environmentally hardened products, and the prognostic model 180 uses potentially different derating factors for the different drive type designations. FIG. 5 shows a table 500 stored in the memory 174 in one example, with columns for different ranges of copper and silver reactivity from an exposed corrosion classification coupon and a column for the corresponding ISA 71.04 environment class (e.g., G1, G2, G3, GX or GX+). The table 500 further includes two additional columns with corresponding drive derating factors $K_{DRIVE}$ for type 1 and type 2 drives.

FIG. 6 shows another example table 600 stored in the memory 174 of FIG. 1. The table 600 has a first column of drive class ratings for different levels of industrial protection (IP) of associated cabinets and enclosures as well as ventilation components (e.g., IP00, IP20/21, IP54 and IP66), where the different IP ratings characterize the resistance of the cabinet enclosure, for example, to dust and solid and liquid and describe the flow rates of the corrosive atmosphere around the component. The table 600 further includes two additional example columns with corresponding component derating factors $K_{COMPONENT}$ for type 1 and type 2 drives. The example table 600 includes component derating values for IGBT components in a motor drive 100. In certain implementations, the memory 174 stores multiple component derating tables as values 190 in FIG. 4 for corresponding respective electrical components of the drive 100 (e.g., IGBTs, fans, filter capacitors, bus capacitors, etc.).

FIG. 7 shows a table 700 with mean time between failure (MTBF) reduction ranges for each respective ISA 71.04 environment class G1, G2, G3, GX or GX+ in one example. In operation, the prognostic model 180 of FIG. 1 determines cumulative degradation and/or remaining useful life and/or time until maintenance is recommended for the overall drive system 100 and for individual components, with compensation for corrosion classification, in which the degradation effects accelerate with more corrosive environments, and the individual derating factors are established through empirical testing and/or from component product data sheets with respect to corrosion related degradation and expected useful life.

Figure 8:
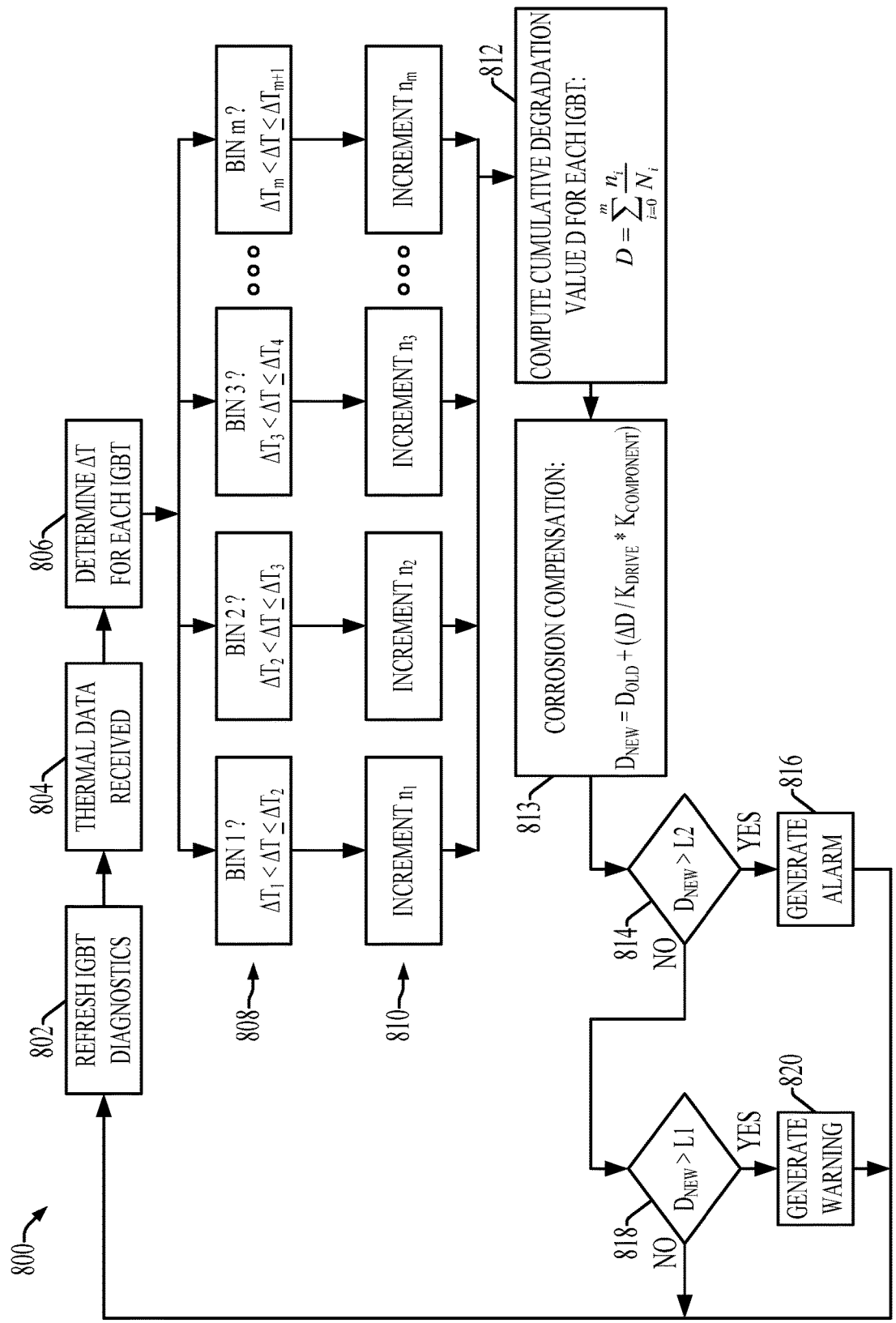
FIG. 8 is a flow diagram of a method for estimating degradation of an electrical system component with corrosion compensation.
Figure 9:
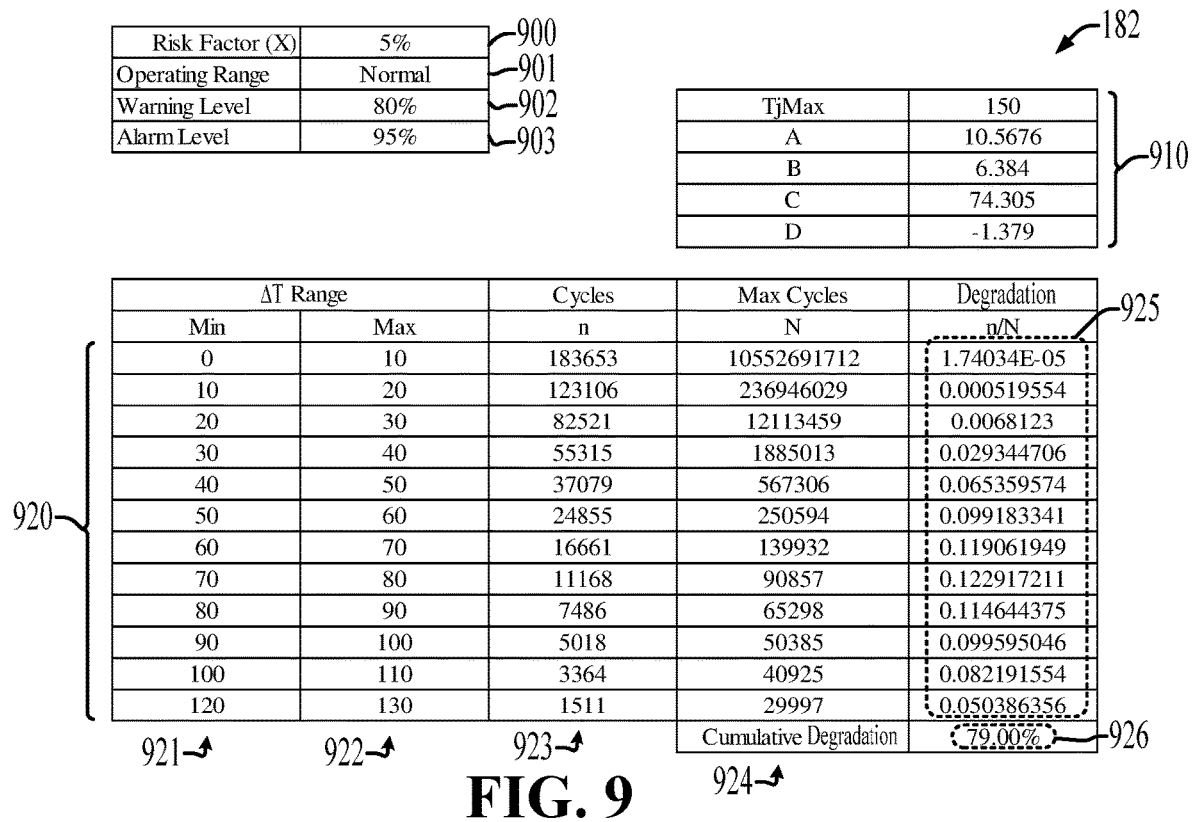
FIG. 9 is a schematic diagram of prognostic values.
Figure 10:
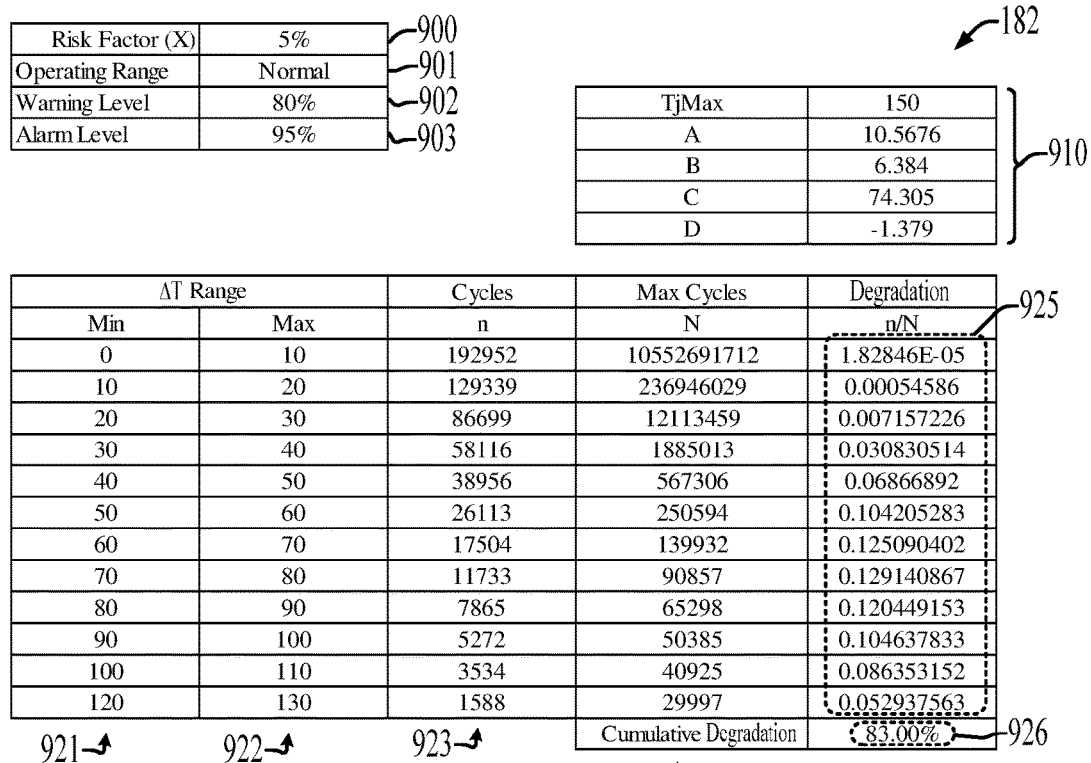
FIG. 10 is a schematic diagram of prognostic values.

Referring also to FIGS. 8-10, FIG. 8 shows a process or method 800 for estimating degradation of an electrical system component caused by an operating parameter that stresses the electrical system component for each of a series of stress cycles, including compensation for corrosion effects. The method 800 in one example is implemented by the processor 172 using one or more of the values 178 to execute the prognostic model program instructions 180 in order to selectively generate one or more warnings and/or alarms 184 based on modeled component degradation. For example, electrical component degradation in the motor drive system example 100 can be modeled by the prognostic model 180 to estimate degradation caused by a temperature change operating parameter $\Delta T$ (e.g., switch and/or diode degradation), a voltage operating parameter V (e.g., capacitor degradation), speed operating parameter RPM (e.g., fan degradation), and ambient temperature T. In general, the processor 172 and the memory 174 operate according to cycle count values n (923 in FIG. 9) maintained as part of the prognostic values 182 in the memory 174 which individually correspond to a range 920 of values (e.g., referred to herein as "bins") of the operating parameter $\Delta T$, V, RPM, and T. In addition, the processor 172 and the memory 174 operate according to a corresponding plurality of maximum cycle values N (924) which individually correspond to one of the ranges 920 and represent the number of stress cycles in the corresponding range 920 at which the component S1-S12, C1-C4 or 160 is expected to have a user defined failure probability value 900 (e.g., a user selected 'risk factor').

In operation for a given stress cycle, the processor 172 increments one of the count values n, 923 that corresponds to the range 920 that includes a measured or sensed value 178 four that stress cycle. The processor 172 computes a cumulative degradation value D, 926 for the electrical system component S1-S12, C1-C4, 160 as the sum of ratios of the individual count values n, 923 divided by the corresponding maximum cycle values N, 924. The processor 172 then compares the computed cumulative damage value D with one or more user defined trigger or threshold levels 902, 903 to selectively generate alarms and/or warnings 184, which can be provided to the user interface 106 of FIG. 1 in one example.

The operation of the processor 172 in implementing the method 800 of FIG. 8 is illustrated and described below in the context of degradation estimation for an IGBT switch S1. Similar operation is undertaken in certain examples for the other switches S2-S12, as well as for the corresponding flyback diodes associated with the switches S1-S12. Furthermore, the described processing 800 and operation of the processor 172 in implementing the prognostic model 180 can be used to assess voltage and/or temperature related degradation of other system electrical components (e.g., filter capacitor C1-C3 and/or DC bus capacitor C4) and/or for degradation of the system cooling fan 160 based on speed cycle stresses. In each example, the range of an operating parameter (e.g., temperature, voltage, speed) that stresses the corresponding electrical system component (e.g., switches, diodes, capacitors, fan motors) is segmented into multiple non-overlapping bins or ranges (920 in FIGS. 9 and 10), and the prognostic values 182 include a maximum cycle value N (924) for each of the bins or ranges. The individual maximum cycle value N, 924 for each range represents the number of stress cycles in the corresponding range 920 at which the component is expected to have a user defined failure probability value 900. In one implementation, a user can set the failure probability value or "risk factor" 900 as well as the threshold warning and alarm levels 902 and 903. In another implementation, the user can set the alarm based on the remaining life threshold. When the remaining lifetime falls below this threshold, the alarm is generated. In one example, the motor drive component is a contactor or breaker, and the operating parameter is no-load breaking Users of electrical systems, such as motor drives 100 can thus be notified when IGBTs or other electrical system components are nearing the end of their useful life, in order to facilitate planned proactive maintenance to avoid or mitigate unplanned system downtime. A user in one example enters values 900-903 (FIG. 9) via the user interface 106 or a network connection, and these values are stored by the processor 172 as part of the prognostic values 182 in the memory 174. In this example, the user defined risk factor 900 represents a user selected failure probability value. An operating range parameter 901 allows the user to select normal or extended temperature range operation for the motor drive 100 (e.g., −20° C. to 40° C. for normal operation, or 40° C. to 55° C. for extended operation). A warning level parameter 902 (e.g., a first level L1) sets a threshold above which the prognostic model 180 will indicate a warning 184 to the user, and an alarm level parameter 903 sets a user defined second level (L2) above which the prognostic model 180 will indicate an alarm 184 to the user via the user interface 106 in one example.

The process 800 in FIG. 8 and the operation of the processor 172 in implementing the prognostic model 180 of the present disclosure advantageously take into account a user's tolerance for risk. The user's risk tolerance for unplanned downtime due to electrical system component failures is accommodated in one example by these three user-defined parameters: warning level, alarm level, and risk factor. The maximum cycle values N, 924 can be obtained from empirical data and/or manufacturer data for a given electrical system component, and the collection of the values 924 represent stress contributions of stress cycle levels over the operating parameter range, and the prognostic model 180 provides a cumulative assessment of the amount of stress imparted on the analyzed electrical component. In one example, the modeling of an IGBT switch S1 is represented by the values 924 based on manufacturer data, testing and/or a mathematical model. This model, as well as the user-specified risk factor 900, are used to create bins of junction-to-case temperature ranges of 5 to 10 degrees wide. In the Examples of FIGS. 9 and 10, 10° C. wide ranges or bins are used over a range from 0° C. to 130° C. representing a reasonable expected operating range for an IGBT switch S1-S12 in the motor drive system 100. Similar models including a reasonable number of two or more bins or operating parameter ranges can be defined for a given electrical component, with the maximum cycle values N for each bin range being predetermined according to manufacturer data, testing and/or a mathematical model. Thus, the described techniques and systems can be used on any type or form of electrical system component, and the present disclosure is not limited to IGBTs or motor drive components. In one example, the motor drive component is a contactor or breaker, and the operating parameter is no-load breaking.

At 802 in FIG. 8, in one example, every few seconds, the processor 172 updates or refreshes the prognostic values 182 by executing the prognostic model program instructions 180 to determine or estimate an updated cumulative degradation value D (e.g., 926 in FIG. 9) for the IGBTs S1-S12 of the example motor drive system 100. In each such stress cycle, the prognostic model 180 can obtain temperature values at 804, for example, from a thermal management component executed by the processor 172 as part of normal drive control functions. At 806, the processor 172 determines a junction to case temperature estimate or temperature difference (e.g., ΔT or "DT") from the thermal data received at 804, such as by subtracting a measured switch temperature from an ambient temperature inside the motor drive enclosure in one example. Thus, the processor 172 receives a first value 178 at 804, 806 that represents the operating parameter ΔT for the given stress cycle. For the given stress cycle, the processor 172 then determines at 808 which bin or range matches the received first value 178, and increments the corresponding cycle count value n, 923 at 810 that corresponds to the range 920 of values of the operating parameter ΔT that includes the first value 178.

At 812, the processor 172 computes a cumulative degradation value D (e.g., 926 in FIGS. 9 and 10 below) for one or more electrical system components (e.g., S1-S12, C1-C4, 160) of the electrical system 100 based on an operating parameter of the component. In one implementation, the processor 172 computes the cumulative degradation value D for the electrical system component S1 in the given stress cycle as the sum of the ratios of the individual cycle count values n, 923 divided by the corresponding maximum cycle values N, 924 of the plurality 920 of values of the operating parameter (e.g., ΔT, V, RPM).

At 813 in FIG. 8, the processor 172 computes a corrosion compensated cumulative degradation value $D_{NEW}$ for the electrical system component S1-S12, C1-C4, 160 based on the cumulative degradation value D and the corrosion rating of the electrical system 100. In one example, the corrosion rating of the electrical system 100 includes a metal reactivity rate (e.g., copper and/or silver reactivity in Å/30 days) of the electrical system 100. In certain implementations, the corrosion rating of the electrical system 100 includes a corrosion classification of the electrical system 100 (e.g., ISA 71.04 environment class G1, G2, G3, GX or GX+). In one example, the processor 172 is programmed to compute the cumulative degradation values D periodically, such as once per minute at 812 in FIG. 8, and the processor 172 modifies or compensates the cumulative degradation values D to determine the corrosion compensated cumulative degradation value $D_{NEW}$ for the respective electrical system components according to the respective drive and component derating factors $K_{DRIVE}$ and $K_{COMPONENT}$.

This provides more accurate estimation of MTBF and estimated remaining lifetime (or cumulative degradation) depending on the robustness of the drive 100 against corrosion and the corrosivity of the operating environment for a given system installation. In the illustrated example, the corrosion compensated cumulative degradation value $D_{NEW}$ is computed in terms of the previous value ($D_{OLD}$) as $D_{NEW}=D_{OLD}+(\Delta D/K_{DRIVE}*K_{COMPONENT})$, where $\Delta D=D_{NEW}-D_{OLD}$, and $K_{DRIVE}$ and $K_{COMPONENT}$ are the respective drive and individual component corrosion derating factors. In certain implementations, moreover, the corrosion compensation intelligently uses respective drive and individual component corrosion derating factors corresponding to the particular drive type and environmental classification, where standard drives in harsh environments will have higher incremental cumulative degradation than extra tough drives in harsh environments.

In one example, the processor 172 begins each update (e.g., once per minute of operation) by reading the latest estimate $D_{OLD}$ of cumulative degradation from non-volatile memory 174 that reflects the amount of life that has been consumed. The processor then computes $\Delta D$ to reflect the amount of additional degradation that has occurred based on voltage, temperatures, stresses, etc. The corrosion compensation at 813 effectively amplifies the degradation based on the corrosivity of the operating environment because the drive and individual component corrosion derating factors $K_{DRIVE}$ and $K_{COMPONENT}$ are unity or less and appear in the denominator of the corrosion compensation adjustment at 813 of FIG. 8. Once the corrosion compensated degradation value $D_{NEW}$ is computed, the processor 172 writes the value into the memory 174 for use in the next computation cycle, and for use in selective reporting of alarms and/or warnings.

In one example, the processor 172 makes a determination at 814 as to whether the cumulative degradation value $D_{NEW}$, 926 for the given stress cycle exceeds a user defined alarm level or threshold value 903 (L2). In the example of FIGS. 9 and 10 below, the user has selected alarm level 903 of L2=95%, with a risk factor 900 of 5%. If so (YES at 814), the processor 172 generates an alarm 184 at 816, and the IGBT diagnostics are again refreshed at 802 in FIG. 8. Otherwise (NO at 814), the processor 172 determines whether the cumulative degradation value $D_{NEW}$, 926 exceeds the first (warning) threshold level L1 (L1<L2) 902. In the example of FIGS. 9 and 10, the user has selected the warning level 902 of L1=80%. If the cumulative degradation exceeds the first threshold level L1 (YES at 818), the processor 172 generates a warning 184 at 820, and refreshes the IGBT diagnostics at 802. Otherwise, if the cumulative degradation $D_{NEW}$ does not exceed either of the threshold levels 902, 903 (NO at 818), the IGBT diagnostics are refreshed at 802, and the processor 172 proceeds with the next stress cycle. In one example, the processor 172 implements similar processing 800 to execute the prognostic model program instructions 180 for each given stress cycle, for each of a number of different system electrical components. For example, the processor can implement the described processing 800 for all of the IGBT switches S1-S12 or a subset thereof, and can implement similar processing to estimate degradation of the associated diodes with respect to case-junction temperature, in which the operating parameter is a junction temperature change $\Delta T$.

Similar processing 800 can be performed with respect to temperature and/or voltage-based stress or degradation of the motor drive capacitor C1-C4 or subsets thereof. In this case, the operating parameter can be a temperature change $\Delta T$ and/or a voltage V. In other examples, the processor 172 implements a prognostic model with respect to degradation of the cooling fan 160, in this case according to motor speed stress cycles and local ambient temperature the motor. In this example, the operating parameter can be a fan speed RPM and ambient temperature. In this regard, different electrical components can be assessed by the processor 172 at different periodic temporally spaced stress cycles, where the temporal length of a stress cycle can be different for different electrical component types.

The disclosed examples allow the IGBT or other component predictive reliability model 180 to adapt to the user needs by considering user defined warning level, alarm level, and amount of risk the user is willing to take for a given application of the electrical system 100. The model update results are provided to the user (e.g., via the user interface 106) in terms of life consumed for each IGBT that can help define maintenance intervals. The model 180 also allows scheduled maintenance, component replacement, etc. to be done in adaptive intelligent usage and risk-based manner as opposed to fixed replacement intervals. This provides a unique IGBT predictive reliability model that takes into account the severity of downtime for their processes.

Figure 11:
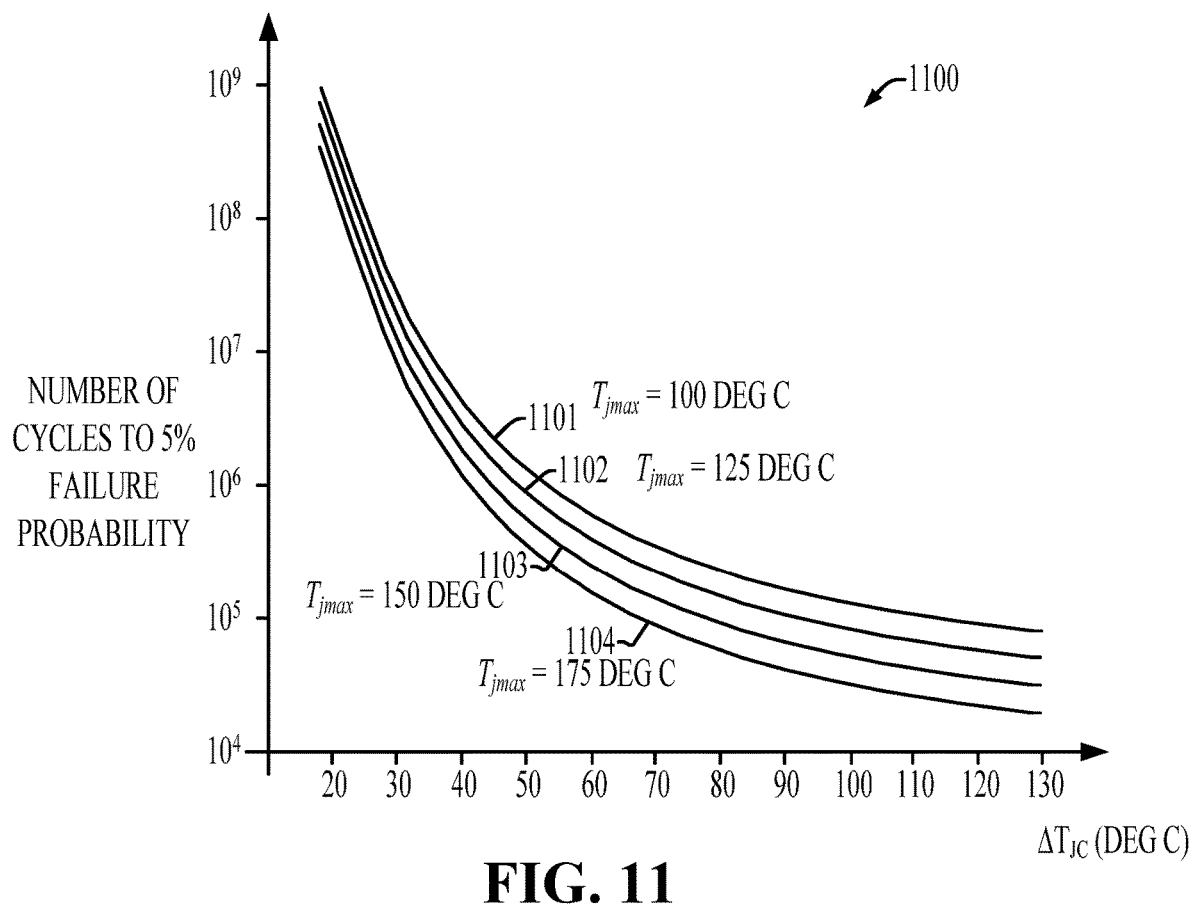
FIG. 11 is a reliability graph.

Turning now to FIGS. 9-11, FIGS. 9 and 10 show example sets of prognostic data 182 with respect to an example IGBT switch S1 in the motor drive 100. The example of FIG. 9 shows the cumulative state of the IGBT S1 with respect to thermal cycle stress at a first example time, and the example of FIG. 10 shows the degradation state of the IGBT S1 at a later time during operation of the motor drive 100. The inventors have appreciated that IGBT reliability for a given time (or cycles) can be expressed using a two parameter Weibull distribution according the following equation (1):

$$R(t)=e^{-(t/\eta)^\beta}, \qquad (1)$$

where $\beta$ is a shape parameter, and $\eta$ is the characteristic life of an IGBT. Rearranging equation (1) yields the following equation (2) to express the relationship between the percentage X % of a population of this type of IGBT component that may fail before a given number of thermal stress cycles (N):

$$N=-\eta \cdot [\ln(1-X)]^{(1/\beta)} \qquad (2)$$

In this case, the value "X" is the user defined risk factor 900 in FIGS. 9 and 10. In one example, if a user is willing to take a 5% chance that IGBTs may fail before expected, then the user can set the Risk parameter 900 to X=0.05. The physics of failure models for IGBTs reliability is based on the Coffin-Mason model, junction-case temperature, and can be expressed in terms of the characteristics life $\eta$ according to the following equation (3):

$$\eta(\Delta T_{jc}) = \frac{m}{\Delta T_{jc}^n}, \quad (3)$$

where $\Delta T_{jc}$ is the IGBT junction-case temperature change value in degrees C., and m and n are constants depending on the specific IGBT electrical component. Equation (4) below provides a universal model for characteristic life has been developed for example IGBT power cycling data:

$$\eta(\Delta T_{jc}) = \frac{10^A}{10^{B \cdot exp(-C \cdot \Delta T^D)}} \quad (4)$$

where $$A = A_1 \cdot T_{j,max} + A_0 \quad (5)$$

$$B = B_1 \cdot T_{j,max} + B_0 \quad (6)$$

$$C = C_1 \cdot T_{j,max} + C_0 \quad (7)$$

$$D = D_1 \cdot T_{j,max} + D_0 \quad (8)$$

The following equation (9) describes an IGBT reliability model by combining equations (4) and (2):

$$N = \frac{10^A}{10^{B \cdot exp(-C \cdot \Delta T_{jc}^D)}} \cdot -[\ln(1-X)]^{(1/\beta)} \quad (9)$$

For IGBTs, the cumulative damage or degradation value D can be computed using Miner's Rule according to the following equation (10):

$$D = \sum_{i=0}^{m} \frac{n_i}{N_i} \quad (10)$$

where N is the maximum number of cycles define by equation (9) for a given risk factor (X) and temperature change value ($\Delta T$), and n is the actual number of cycles. The examples of FIGS. 9 and 10 show prognostic values 182 for an implementation using a maximum junction temperature ($T_{jmax}$) of 150° C., A (equation (5) above)=10.5676, B (equation (6) above)=6.384, C (equation (7) above)=74.305 and D (equation (8) above)=−1.379. As previously mentioned, a different maximum junction temperature $T_{jmax}$ can be set by the user according to the operating range parameter 901. In one example, the processor 172 implements the prognostic model program instructions 180 according to user settings from the user interface 106, computes the values 910 for A, B, C and D according to manufacture data, test data and/or a mathematical model, and the processor 172 divides the corresponding operating parameter range into a reasonable number of ranges or bins 920. In the example of FIGS. 9 and 10, 10° C. ranges are provided for the junction-case temperature change value $\Delta T$ (indicated as DT in FIGS. 9 and 10) including a minimum temperature 921 and a maximum temperature 922 for each range, and the processor 172 computes and stores the corresponding maximum cycle values N 924 for the corresponding been ranges.

As described above in connection with FIG. 8, the processor 172 maintains cycle count values "n" during the operational usage of the corresponding electrical system component (e.g., IGBT), and in each corresponding stress cycle, increments one of the count values depending on the first value received for the current stress cycle. As shown in FIG. 9, the IGBT S1 has undergone a number of cycles n in each of the different temperature range bins, and each range contributes a corresponding degradation component value 925 "n/N". To determine the cumulative degradation value 926, the processor 172 adds the individual degradation component values 925. In the example of FIG. 9, the IGBT has undergone 79% cumulative degradation based on the junction-case temperature cycle stress. In this example, the warning and alarm threshold levels 902 and 903 have not been exceeded by the IGBT, and accordingly the processor 172 does not provide any warning or alarm 184 to the user. After further operation of the IGBT, as shown in FIG. 10, the cumulative degradation value 926 has reached 83%, and in each given stress cycle, the processor 172 provides a warning 184 based on the degradation exceeding the warning level threshold 902. The user may schedule preventative maintenance to replace the IGBT based on the warning or may wait until an alarm level is reached (e.g., 95% in this example). Any remedial action can be taken automatically in certain examples, for instance, the processor 172 can perform a controlled shutdown of the motor drive system 100 based on the degradation value 926 reaching the alarm level 903. In certain examples, the processor 172 operates to update the counter values 923 in substantially real time, for example, periodically at every given stress cycle, and the degradation calculations can, but need not, be updated as frequently. For instance, the counter values 923 can be updated in substantially real time, while the prognostic assessment via the computation of the values 925 and 926 can be performed daily or weekly or at some other significantly longer interval.

FIG. 11 shows an example reliability graph 1100 including curves 1101, 1102, 1103 and 1104 showing the expected number of cycles to 5% failure probability as a function of the junction case temperature change value $\Delta T_{JC}$ for four example Max junction temperature values 100° C., 125° C., 150° C. and 175° C., respectively. As previously discussed, the curves 1101-1104 represent the modeling which is incorporated into the values N 924 representing the maximum number of stress cycles the IGBT can undergo within the corresponding temperature change value range before the predefined risk factor level of degradation is reached. The curves 1101-1104, moreover, can be representative of manufacturer data for a given electrical component, empirical testing of a given type of electrical component and/or typing of an otherwise developed mathematical model for the given electrical component.

A user may also desire to plan maintenance of one or more system components. The processor 172 in certain examples is programmed to predict when a fan or other component will reach the alarm state or other predetermined remaining life value. The processor 172 in one example uses a rate of damage per hour ($\Delta CD$) derived from customer usage as a basis to predict a remaining time $t_r$. In one implementation, the processor 172 is programmed to implement a simple infinite-impulse-response (IIR) low-pass filter to calculate a pseudo rolling average rate of degradation $\Delta CD$ according to the following equation (11) using the cumulative degradation value CD (referred to above as "D"):

$$\Delta CD_i = \Delta CD_{i-1} + \frac{UC0}{UC1 + UC0} \cdot [(CD_i - CD_{i-1}) - \Delta CD_{i-1}] \quad (11)$$

where UC0 is the update time (e.g., every 1 hour, every 1 minute, etc.) and UC1 is the time constant of the cumulative degradation rate calculation (e.g., 96 hours or 4 days in one implementation, 720 hours or 30 days in another implementation). The processor in one example computes a predicted remaining time ($t_r$) when the fan or other component needs to be replaced (e.g., when a user-specified event level L1 will be reached) using the current component cumulative degradation value (CD) and a filtered use case cumulative degradation accumulation rate (ΔCD) from Eq. (11), according to the following equation (12):

$$t_r = \frac{(L1 - CD)}{\Delta CD} \quad (12)$$

where the units for replacement time $t_r$ are based on the use case definition (e.g., hours).

Figure 12:
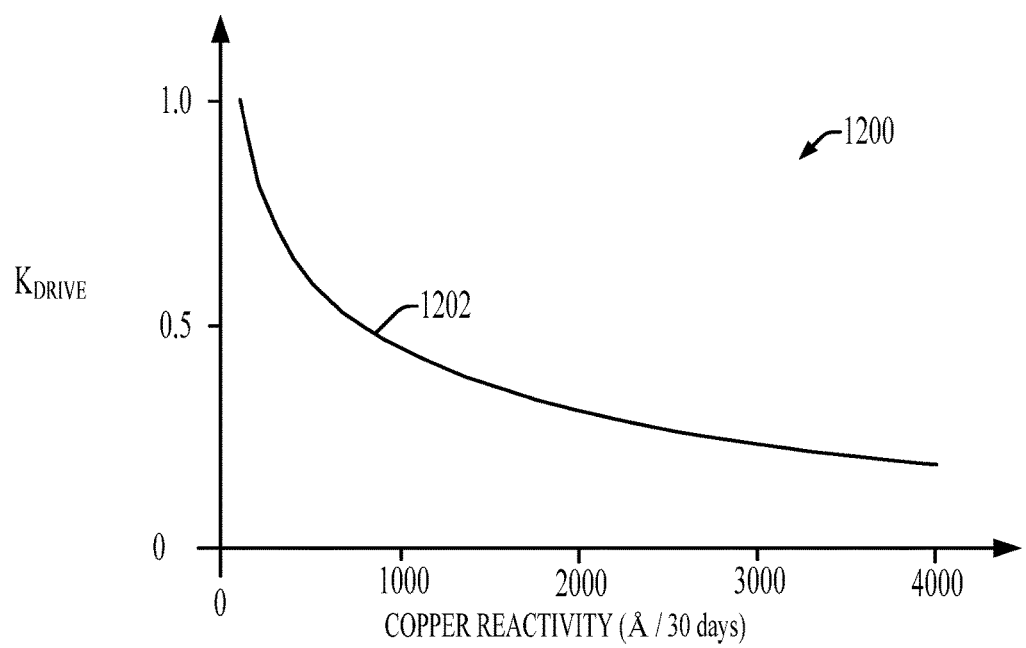
FIG. 12 is a copper reactivity graph.

FIG. 12 shows a graph 1200 with a curve 1202 that represents copper reactivity in an example drive system installation in terms of Å corrosion growth per 30 days. In the above examples, the copper and/or silver reactivity was used to classify a given environment into a discreet number of classes (e.g., the ISA 71.04 environment classes G1, G2, G3, GX or GX+). In an alternate implementation, the processor 172 scales the derating factor (e.g., $K_{DRIVE}$) per ISA 71.04 based on copper and silver values entered into the drive 100 rather than step increments per a table. As seen in FIG. 12, copper corrosion is nonlinear, and measurements over longer or shorter test times can be reduced to a normalized one-month value using the following relationship $X_1 = X(t_1/t)^A$, where $X_1$ is the equivalent film thickness after 30 days, X is the measured film thickness after time t, $t_1$ is 30 days, and t is the actual test time in days. In one example, A is 0.3 for G1, 0.5 for G3, and 1.0 for G3 and GX environments.

FIG. 13 shows a table 1300 for an alternate implementation, in which the drive user or manufacturer configures the system with a specified industry type, and the processor 172 implements corrosion compensation using a drive derating factor (e.g., $K_{DRIVE}$) determined according to the specified industry (e.g., automotive, tire/rubber manufacturing, waste water treatment, pulp and paper processing, etc.). In this example, instead of entering corrosion coupon values, the user can select from a number of rendered industry descriptions when configuring the drive 100, and the processor 172 configures the corrosion compensation engine using the predetermined corresponding derating value or values (e.g., in further consideration of a selected drive type in certain examples).

The described examples extend the capabilities of predictive maintenance by providing a method and system to adjust the algorithms to compensate for corrosive environments using low-cost, commercially accepted methods to assess the environment (e.g., corrosion coupons), and provides usage for different drive types and different industrial environments.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense. In accordance with further aspects of the present disclosure, a non-transitory computer readable medium is provided, such as a computer memory, a memory within a power converter control system (e.g., controller memory 174, a CD-ROM, floppy disk, flash drive, database, server, computer, etc.), which includes computer executable instructions for performing the above-described methods. The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method, comprising:
computing a cumulative degradation value for an electrical component of an electrical system based on an operating parameter of the electrical component; and
computing a corrosion compensated cumulative degradation value for the electrical component based on the cumulative degradation value and a corrosion rating of the electrical system.

2. The method of claim 1, wherein the corrosion rating of the electrical system includes a metal reactivity rate of the electrical system.

3. The method of claim 1, wherein the corrosion rating of the electrical system includes a corrosion classification of the electrical system.

4. The method of claim 1, further comprising:
selectively generating a warning signal or message if the cumulative degradation value for the given stress cycle exceeds a user defined first threshold value; and
selectively generating an alarm signal or message if the cumulative degradation value for the given stress cycle exceeds a user defined second threshold value, the second threshold value being greater than the first threshold value.

5. The method of claim 1, further comprising:
selectively generating a warning signal or message if a remaining lifetime value for the electrical component falls below a user defined first threshold value.

6. The method of claim 1, wherein the electrical system component is an insulated gate bipolar transistor (IGBT), and wherein the operating parameter is a junction temperature change or a base plate temperature change.

7. The method of claim 1, wherein the electrical component is a capacitor, and wherein the operating parameter is one of a temperature and a voltage.

8. The method of claim 1, wherein the electrical component is a fan, and wherein the operating parameter is a fan speed and a local temperature around the fan.

9. The method of claim 1, wherein the electrical component is a contactor or breaker, and wherein the operating parameter is no-load breaking.

10. The method of claim 1, wherein:
computing the cumulative degradation value comprises computing an amount of additional degradation that has occurred in a given stress cycle based on an operating parameter of the electrical component and independent of corrosion; and
computing the corrosion compensated cumulative degradation value comprises amplifying the amount of additional degradation based on a corrosivity of the operating environment of the electrical component.

11. A non-transitory computer readable medium with computer executable instructions which, when executed by a processor, cause the processor to:
compute a cumulative degradation value for an electrical component of an electrical system based on an operating parameter of the electrical component; and
compute a corrosion compensated cumulative degradation value for the electrical system component based on the cumulative degradation value and a corrosion rating of the electrical system.

12. The non-transitory computer readable medium of claim 11, wherein the corrosion rating of the electrical system includes a metal reactivity rate of the electrical system.

13. The non-transitory computer readable medium of claim 11, wherein the corrosion rating of the electrical system includes a corrosion classification of the electrical system.

14. The non-transitory computer readable medium of claim 11, further comprising computer-executable instructions which, when executed by the processor, cause the processor to:
selectively generate a warning signal or message if the cumulative degradation value for the given stress cycle exceeds a user defined first threshold value; and
selectively generate an alarm signal or message if the cumulative degradation value for the given stress cycle exceeds a user defined second threshold value, the second threshold value being greater than the first threshold value.

15. A system, comprising:
a processor programmed to:
compute a cumulative degradation value for an electrical component of an electrical system based on an operating parameter of the electrical component; and
compute a corrosion compensated cumulative degradation value for the electrical component based on the cumulative degradation value and a corrosion rating of the electrical system.

16. The system of claim 15, wherein the corrosion rating of the electrical system includes a metal reactivity rate of the electrical system.

17. The system of claim 15, wherein the corrosion rating of the electrical system includes a corrosion classification of the electrical system.

18. The system of claim 15, wherein the processor is programmed to:
selectively generate a warning signal or message if the cumulative degradation value for the given stress cycle exceeds a user defined first threshold value; and
selectively generate an alarm signal or message if the cumulative degradation value for the given stress cycle exceeds a user defined second threshold value, the second threshold value being greater than the first threshold value.

19. The system of claim 15, wherein the electrical component is a motor drive component.

20. The system of claim 19, wherein the motor drive component is an insulated gate bipolar transistor (IGBT), and wherein the operating parameter is a junction temperature change.

21. The system of claim 15, wherein the processor is programmed to:
selectively generate a warning signal or message if a remaining lifetime value for the electrical component falls below a user defined first threshold value.

* * * * *